(12) United States Patent
Haag et al.

(10) Patent No.: US 6,454,920 B1
(45) Date of Patent: *Sep. 24, 2002

(54) MAGNETRON SPUTTERING SOURCE

(75) Inventors: Walter Haag, Grabs; Pius Grunenfelder, Wangs; Urs Schwendener, Buchs; Markus Schlegel, Azmoos, all of (CH); Siegfried Krassnitzer, Feldkirch (AT)

(73) Assignee: Unaxis Trading AG, Trubbach (CH)

( * ) Notice: Subject to any disclaimer, the term of this patent is extended or adjusted under 35 U.S.C. 154(b) by 0 days.

This patent is subject to a terminal disclaimer.

(21) Appl. No.: 09/888,923

(22) Filed: Jun. 25, 2001

Related U.S. Application Data

(62) Division of application No. 09/587,543, filed on Jun. 5, 2000, now Pat. No. 6,284,106, which is a division of application No. 09/026,446, filed on Feb. 19, 1998, now Pat. No. 6,093,293.

(30) Foreign Application Priority Data

Dec. 17, 1997 (CH) .................................................. 2897/97

(51) Int. Cl.[7] .............................................. C23C 14/34
(52) U.S. Cl. ........................... 204/298.12; 204/298.19; 204/298.21; 204/298.14; 204/298.08; 204/298.07; 204/298.26; 204/298.2; 204/298.16; 204/298.09; 204/298.18; 204/298.22

(58) Field of Search ..................... 204/298.19, 298.21, 204/298.12, 298.14, 298.08, 298.07, 298.26, 298.2, 298.16, 298.09, 298.18, 298.22

(56) References Cited

U.S. PATENT DOCUMENTS

| | | | | |
|---|---|---|---|---|
| 6,093,293 A | * | 7/2000 | Haag et al. | 204/298.12 |
| 6,146,734 A | * | 11/2000 | Ohno et al. | 428/64.1 |
| 6,284,106 B1 | * | 9/2001 | Haag et al. | 204/192.12 |
| 6,290,826 B1 | * | 9/2001 | Obinata et al. | 204/298.28 |
| 6,350,356 B1 | * | 2/2002 | Welty | 204/298.12 |

* cited by examiner

Primary Examiner—Alan Diamond
(74) Attorney, Agent, or Firm—Notaro & Michalos P.C.

(57) ABSTRACT

A sputter source has at least two electrically mutually isolated stationar bar-shaped target arrangements mounted one alongside the other and separated by respective slits. Each of the target arrangements includes a respective electric pad so that each target arrangement may be operated electrically independently from the other target arrangement. Each target arrangement also has a controlled magnet arrangement for generating a time-varying magnetron field upon the respective target arrangement. The magnet arrangements may be controlled independently from each others. The source further has an anode arrangement with anodes alongside and between the target arrangements and/or along smaller sides of the target arrangements.

43 Claims, 7 Drawing Sheets

MAGNETRON SPUTTERING SOURCE

REFERENCE TO RELATED APPLICATION

This is a divisional of application Ser. No. 09/587,543 filed Jun. 5, 2000 now U.S. Pat. No. 6,284,106 which itself is a divisional of application Ser. No. 09/026,446 filed Feb 19, 1998 and now U.S. Pat. No. 6,093,293, which claims priority on Swiss application 2897/97, filed Dec. 17, 1997.

SUMMARY OF THE INVENTION

This invention relates to a magnetron sputtering source, a vacuum chamber and for such source and a vacuum coating system.

In essence the present invention is based on the need for depositing on large-surface, in particular rectangular substrates with an area of at least 900 $cm^2$, a film having a homogenous thickness distribution, by means of sputter coating, in particular also reactive sputter coating. Such substrates are in particular used in the manufacture of flat panels, normally on glass substrates thinner than 1 mm, such as for TFT panels or plasma display panels (PDP).

When magnetron sputter coating large surfaces, even larger sputter surfaces and consequently larger targets are normally required unless the sputtering source and the substrate are moved relative to each other. However, this results in problems with respect to (a) uniformity of the process conditions on the large-surface target, with particular severity in reactive sputter coating (b) erosion profile (c) cooling (d) strain on the large targets, in particular through atmospheric pressure and coolant pressure.

In order to solve the mechanical strain problem (d) relatively thick target plates have to be used which in turn reduces the magnetic penetration and consequently the electron trap effect for a given electrical input power. If the power is increased this results in cooling problems (c), in particular because elaborate methods are needed for achieving good contact between the target and the cooling medium, and also because of the obstruction resulting from the installations on the back for accommodating the magnets. It is also known that in magnetron sputtering, be it reactive or non-reactive, the target arrangement normally consisting of a sputtering area defining target plate made of the material to be sputtered and a bonded mounting plate, the target is sputter eroded along so-called "race tracks". On the sputter surface one or several circular erosion furrows are created due to the tunnel-shaped magnet fields applied to the target along specific courses, which produce circular zones with elevated plasma density. These occur due to the high electron density in the area of the tunnel-shaped circular magnetron fields (electron traps). Due to these "race tracks" an inhomogenous film thickness distribution occurs already on relatively small-surface coating substrates arranged in front of the magnetron sputtering source. In addition the target material is inefficiently utilized because the sputter erosion along the "race tracks" removes little material from target areas outside these tracks which results in a wave-shaped or furrow-shaped erosion profile. Because of these "race tracks" the actually sputtered surface even of a large target is small relative to the substrate surface. For eliminating the effect of said "race tracks" on the coating it would be possible to move the sputtering source and the substrate to be coated relative to each other, as mentioned above, however, this results in a lower deposition rate per unit of time. If locally higher sputtering power is used, cooling problems are incurred in systems using relative motion.

In trying to achieve the desired goal basically four complexes of problems (a), (b), and (c), (d) are encountered whose individual solutions aggravate the situation with respect to the others; the solutions are mutually contradictory.

The objective of the present invention is to create a magnetron sputtering source through which said problems can be remedied, that can be implemented in practically any size, and that is capable of economically achieving a homogenous coating thickness distribution on at least one large-surface substrate that is stationary relative to the source. In addition to maintaining highly uniform process conditions the source shall be suitable for sensitive reactive processes with high deposition or coating rates. In reactive processes, inhomogenous "race track" effects lead to known, severe problems due to the large plasma density gradients.

This is achieved by the magnetron sputtering source according to the present invention in which at least two, preferably more than two, electrically isolated long target arrangements are placed parallel to each other at a distance that is significantly smaller than the width of the target arrangement, where each target arrangement has its own electrical connections, and where in addition an anode arrangement is provided. The targets of the target arrangements have preferably rounded corners, following the "race track" paths.

On such a magnetron sputtering source according to the invention with independently controllable electrical power input to the individual target arrangements, the film thickness distribution deposited on the substrate located above can already be significantly improved. The source according to the invention can be modularly adapted to any substrate size to be coated.

With respect to the overall arrangement the anode arrangement can—unless it is temporarily formed by the target arrangements themselves—be located outside the overall arrangement but preferably comprises anodes that are installed longitudinally between the target arrangements and/or on the face of the target arrangement, but particularly preferred longitudinally.

Also preferred is a stationary magnetron arrangement on the source; the latter is preferably formed by a magnet frame that encircles all the target arrangements, or is preferably implemented with one frame each encircling each target arrangement. Although it may be feasible and reasonable to implement the magnets on the frame(s), or on the stationary magnet arrangement at least partially by means of controllable electric magnets, the magnets of the arrangement or the frame are preferably implemented with permanent magnets.

Through a corresponding design of said stationary magnet arrangement, preferably the permanent-magnet frames with respect to the magnet field they generate on the immediately adjacent target arrangement, the aforementioned film thickness distribution on the substrate and the utilization efficiency of the long targets can be further enhanced through specific shaping of "race tracks".

Magnet arrangements are provided preferably below each of the at least two target arrangements. These may be locally stationary and be fixed over time in order to create the tunnel shaped magnet field on each of the target arrangements. Preferably they are designed in such a way that they cause a time-dependent variation of the magnet field pattern on the target arrangements. With respect to the design and the generation of the magnet field pattern on each of the target arrangements according to the invention, we refer to EP-A-0 603 587 or U.S. Pat. No. 5,399,253 of the same application, whose respective disclosure content is declared to be an integral part of the present description.

According to FIG. 2 of EPO-A-0 603 587 the location of the magnet pattern and consequently the zones of high plasma density can be changed as a whole, but preferably it is not changed, or changed only insignificantly, whereas according to FIGS. 2 and 3 of said application the location of the apex—the point of maximum plasma density—is changed.

For changing the location of the zones or the apex on the magnet arrangements, selectively controlled electric magnets—stationary or movable—can be provided below each of the target arrangements, but far preferably this magnet arrangement is implemented with driven movable permanent magnets.

A preferred, moving magnet arrangement is implemented with at least two magnet drums arranged longitudinally below the driven and pivot bearing mounted target arrangements, again preferably with permanent magnets as illustrated, for an individual target, in FIGS. 3 and 4 of EP-A-0 603 587.

The magnet drums are driven with pendulum motion with a pendulum amplitude of preferably $\leq \tau/4$. With respect to this technique and its effect we again refer fully to said EP-A-0 603 587 or U.S. Pat. No. 5,399,253 respectively which also in this respect are declared to be an integral part of the present patent application description.

In summary, at least two driven and pivot bearing mounted permanent magnet drums extending along the longitudinal axis of the target arrangement are preferably provided.

In the preferred manner with the electrical target arrangement supply the field of said stationary magnet arrangement, in particular said frames with the field/time-variable magnet arrangement below each target arrangement, preferably the magnet drums a set of influencing variables is available which in combination allow extensive optimization of the deposited film thickness distribution, in particular with respect to its homogeneity. In addition a high degree of target material utilization is achieved. Highly advantageous is that preferably—with shift of the magnet field apex on the target arrangement—the plasma zones are not shifted in a scanning manner but that within the zones the plasma density is changed through wobbling.

To allow maximum sputter power input the target arrangements are optimally cooled by mounting them on a base where the target arrangement surfaces facing the base are largely covered by cooling media channels which are sealed against the base by means of foils. Large-surface heat removal is achieved because the pressure of the cooling medium presses the entire foil surface firmly against the target arrangements to be cooled.

On the magnetron sputtering source according to the invention a base, preferably made at least partially from an electrically insulating material, preferably plastic, is provided on which in addition to said target arrangements the anodes and, if existing, the stationary magnet arrangement, preferably permanent magnet frames, the magnet arrangement below the target arrangements, preferably the moving permanent magnet arrangements, in particular said drums, as well as the cooling medium channels, are accommodated.

The base is designed and installed in such a way that it separates the vacuum atmosphere and the external atmosphere. In this way the target arrangement can be more flexibly designed with respect to pressure-induced mechanical strain.

Another optimization or manipulated variable for said large-surface film thickness distribution is obtained by providing gas outlet openings, distributed on the longitudinal side of the target arrangement, which openings communicate with a gas distribution system. This makes it possible to admit reactive gas and/or working gas with specifically adjusted distribution into the process chamber above the source according to the invention of a vacuum treatment chamber or system according to the invention.

The rectangular target arrangements are preferably spaced apart by max. 15%, preferably max. 10% or even more preferably max. 7% of their width.

In a preferred design the lateral distance between the individual target arrangements d is 1 mm≦d≦230 mm, where preferably 7 mm≦d≦20 mm.

Width B of the individual target arrangements is preferably 60 mm≦B≦350 mm, more preferably 80 mm≦B≦200 mm and their length L preferably 400 mm≦L≦2000 mm.

The length of the individual target arrangements relative to their width is at least the same, preferably considerably longer. Although the sputtering surfaces of the individual target arrangements are flat or pre-shaped and preferably arranged along one plane, it is feasible to arrange the lateral sputtering surfaces closer to the substrate to be coated than the ones in the middle, possible also inclined, in order to compensate any edge effects on the film thickness distribution, if necessary.

The electrons of the magnetron plasma circulate along the "race tracks" in a direction defined by the magnet field and the electrical field in the target surface area. It has been observed that the routing of the electron path or its influence upon it and consequently the influence on the resulting erosion furrows on the target surfaces can be specifically optimized by creating the magnet field along the longitudinal axes of the target arrangements and by varying the shape of said field not only with respect to time but also location. With a magnet frame—preferably one each, and also preferably one permanent magnet frame each—this is preferably achieved by positioning and/or by the selected strength of the magnets on the frame, and/or by providing magnet arrangements each below the target arrangements, preferably said permanent magnet drums, by correspondingly varying the strength and/or relative position of the magnets on the magnet arrangement. As the electrons move in a circular path in accordance with the magnet field polarity, it has been observed that apparently due to drift forces the electrons, in particular in the narrow side areas of the target arrangements and in accordance with the direction of their movement, the electrons in corner areas that are diagonally opposite are forced outward. For this reason it is proposed that with the provided magnet frame the field strength created by the frame magnets which are specular symmetrical to the target "rectangle" diagonal be preferably designed with a locally different shape.

In a preferred design version of the source according to the invention the target arrangements are fixed by means of linear bayonet catches, in particular in combination with their cooling via pressure loaded foils of the aforementioned type. In this way the arrangements can be very easily replaced after the pressure in the cooling medium channels has been relieved; the greater part of the target arrangement back side remains accessible for cooling and no target arrangement fixing devices are exposed toward the process chamber.

A preferred source according to the invention features more than two target arrangements, preferably five or more.

By using a magnetron sputtering source according to the invention on a sputter coating chamber on which, with a clearance from the latter, a substrate holder for at least one, preferably planar substrate to be sputter coated is provided, it is possible to achieve an optimally small ratio $V_{QS}$ between the sputtered source surfaces $F_Q$ and the substrate surface $F_S$ to be sputtered, where:

$V_{QS} \leq 3$, preferably $V_{QS} \leq 2$, where particularly preferred $1.5 \leq V_{QS} \leq 2$.

This significantly increases the utilization efficiency of the source. In a sputter coating chamber according to the invention with said source this is achieved to an even higher degree by choosing the distance D between the virgin surface of the magnetron sputtering source and the substrate in such a way that it is essentially equal to the width of a longitudinal target arrangement, preferably 60 mm $\leq$ D $\leq$ 250 mm, preferably 80 mm $\leq$ D $\leq$ 160 mm On a vacuum coating system according to the invention with a sputter coating chamber according to the invention and consequently the magnetron sputtering source according to the invention, the target arrangements are each connected to an electrical generator or current sources, where said generators can be controlled independently of each other.

The sputter coating system according to the invention with at least three long target arrangements is preferably operated in such a way that the two outer target arrangements are operated with 5 to 35% more sputtering power, preferably with 10 to 20% more sputtering power than the inner target arrangements. The aforementioned "scanning" of the target arrangements. The aforementioned "scanning" of the target arrangements with respect to the position of the plasma zones and in particular the preferred "wobbling" of the apex of the tunnel magnet fields and consequently the plasma density distribution, preferably realized by means of said magnet drums in pendulum operation, is preferably performed with a frequency of 1 to 4 Hz, preferably approx. 2. Hz. The pendulum amlitude of the drum is preferably $\hat{\phi} \leq \Pi/4$ ($\hat{\phi}$ being the peak value for $\phi$). The coating thickness distribution on the substrate is further optimized through an appropriate design of the path/time profiles of said shift in position.

It should be emphasized that for this purpose also the generators connected to the target arrangements can be controlled for outputting mutually dependent, time modulated signals.

In addition the electrical supply of the target arrangements and/or the distributed gas inlets and/or the magnet field distribution are controlled in such a way or modulated in time in such a way that the desired, preferably homogenous, film thickness distribution on the substrate is achieved.

The magnetron sputtering source is preferably operated with a power density p of 1 W/cm$^2 \leq$ p $\leq$ 30 W/cm$^2$, in particular for reactive film deposition, preferably from metallic targets, and in particular ITO films with 1 W/cm$^2 \leq$ p $\leq$ 5 W/cm$^2$, and for sputter coating metal films preferably with 15 W/cm$^2 \leq$ p $\leq$ 30 W/cm$^2$.

As has been recognized in conjunction with the development of said magnetron sputtering source according to the invention, it is basically advantageous, in particular with target plate arrangements that are significantly longer than wide, to design the magnet field strength of the magnetron field, viewed in the longitudinal direction of the target arrangements and in particular their lateral areas, with a locally different shape.

However, this insight is generally applicable to long magnetrons.

For this reason it is proposed for a long magnetron source according to the invention which comprises a time-variable, preferably moving magnet system, to assign a magnet frame to the target arrangement, preferably a permanent magnet frame where the field strength of the frame magnets measured in one given chamber direction, is designed locally different along the longitudinal side of the target arrangements. For compensating said drift forces acting on the circulating electrons it is proposed to design this field strength locally different essentially specular symmetrical to the target diagonal.

The present invention under all its aspects is in particular suited to sputter coating substrates, in particular large-surface and preferably plane substrates by means of a reactive process, preferably with an ITO film (Indium Tin Oxide). The invention is also suited to coating substrates, in particular glass substrates, used in the production of flat panel displays, in particular TFT or PDP panels, where basically the possibility is opened to highly efficiently sputter coat also large substrates, for example, also semi-conductor substrates, with minimal reject rates either by means of a reactive or non-reactive process, but in particular also reactive.

Especially in sputter coating processes, in particular in ITO coating, low discharge voltages for achieving high film quality, in particular low film resistances, also without tempering steps, are essential. This is achieved by means of the source according to the invention.

It also achieves effective suppression of arc discharges.

The invention is subsequently explained based on illustrated examples:

DESCRIPTION OF THE PREFERRED EMBODIMENT

Figure 1:
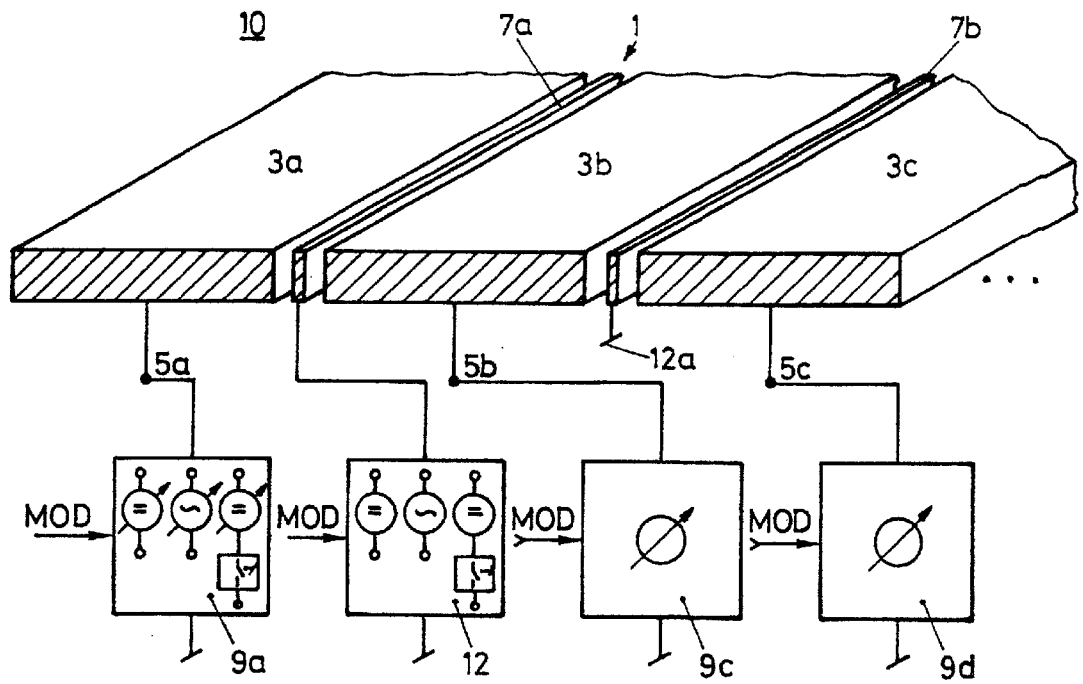
FIG. 1 Magnetron sputtering source according to the invention, electrically operated in a first version.

FIG. 1 schematically shows a magnetron sputtering source 1 according to the invention in its basic configuration. It comprises at least two, or as illustrated, for example, three long target arrangements 3a to 3c. The additional devices to be provided on a magnetron sputtering source, such as the magnet field sources, cooling facilities, etc. are not shown in FIG. 1. Source 1 has separate electrical connections 5 on each target arrangement. For example, strip shaped anodes 7a, 7b are provided preferably between the longitudinally spaced target arrangements 3.

Figure 2:
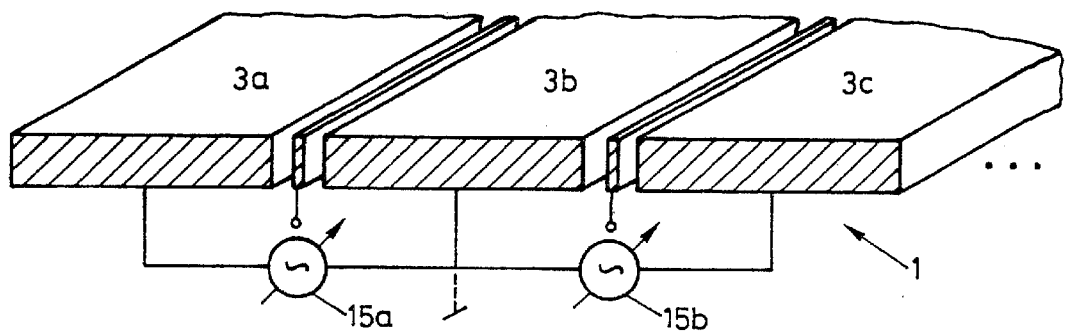
FIG. 2 Schematic representation of the sputtering source according to FIG. 1 in another electrical circuit configuration.
Figure 3:
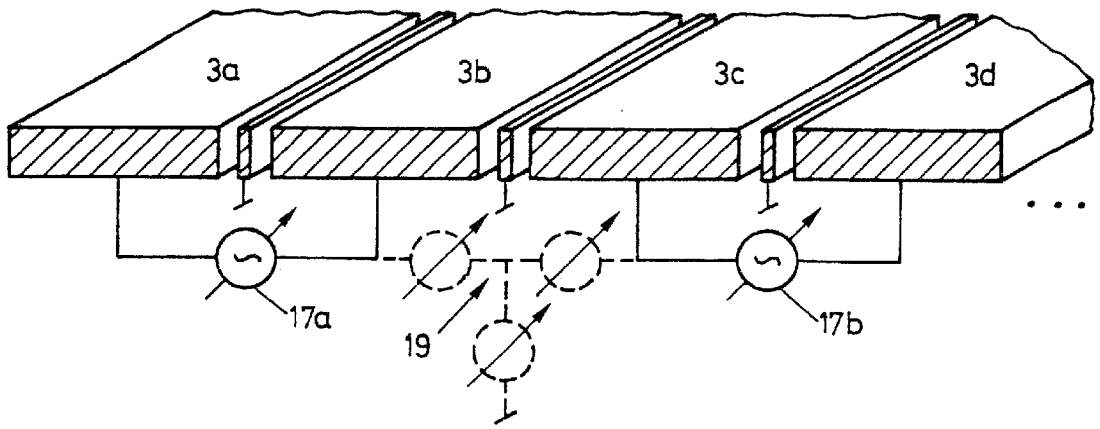
FIG. 3 Another circuit configuration of the sputtering source according to the invention, shown analogously to FIG. 1.

Because the target arrangements 3 are electrically insulated from each other and have separate electrical terminals 5, independent electrical wiring as subsequently also described in conjunction with FIGS. 2 and 3 is possible.

As shown in FIG. 1 each target arrangement 3 is connected to a generator 9, each of which generators can be controlled independently of each other and which do not necessarily have to be of the same type. As shown schematically the generators can be all of the same type or implemented in any mixed combination of DC generators, AC generators, AC and DC generators, generators for outputting pulsed DC signals, or DC generators with intermediate generator output, and with the chopper unit for the corresponding target arrangement. With respect to their design and operating principle full reference is made to said EP-A-0 564 789 or U.S. application Ser. No. 08/887 091.

Also with respect to the electrical operation of the anodes 7 there is complete freedom in that they are operated either with DC, AC, DC with superposed AC or pulsed DC voltage, or possibly via one of the said chopper units, or, as shown at 12a, connected to reference potential. By varying the electrical cathode or target arrangement mode and possibly also the electrical anode mode, distributed across the source surface formed by the target arrangements, the distribution of sputtered material and consequently the distribution on a substrate (not shown) arranged above the source can be adjusted.

Generators 9 can be time modulated with mutual dependence, as shown by the modulation inputs MOD, in order to specifically modulate in the form of a travelling wave, the electrical operating conditions above the target arrangements.

FIGS. 2 and 3 show, with the same position symbols, additional electrical wiring arrangements of source 1 according to the invention at which (not shown) an anode arrangement is not necessary.

As shown in FIGS. 2 and 3 the target arrangements 3 are connected in pairs to the inputs of AC generators 15a, 15b or 17a 17b respectively, where also here generators 15 or 17 can optionally output AC superposed DC signals or pulsed DC signals. Again, generators 15, 17 are modulated, if desired, for example an AC output signal practically as carrier signal, with an amplitude modulation.

Whereas according to FIG. 2 one target arrangement 3b each is connected to an input of one of the generators 15a and 15b, target arrangements 3 as shown in FIG. 3 are connected in pairs via generators 17. As shown with dashed lines at 19 it is possible, in the sense of "common mode" signals, as well as in the design according to FIG. 2 as well as the one in FIG. 3, to jointly connect individual target arrangement groups to different potentials. If a wiring technique according to FIG. 2 or 3 is chosen, the generators in a preferred design version are operated with a frequency of 12 to 45 kHz. With respect to a "common mode" potential, as for example, the mass potential shown in FIG. 2, target arrangements connected in pairs to a generator are alternately connected to positive and negative potentials.

As can be seen from the diagrams in FIGS. 1 to 3 the magnetron source according to the invention allows very high flexibility for electrically operating the individual target arrangements 3 and consequently to specifically design the distribution of the sputtered material in process chamber 10 and the deposition on a substrate.

Figure 4:
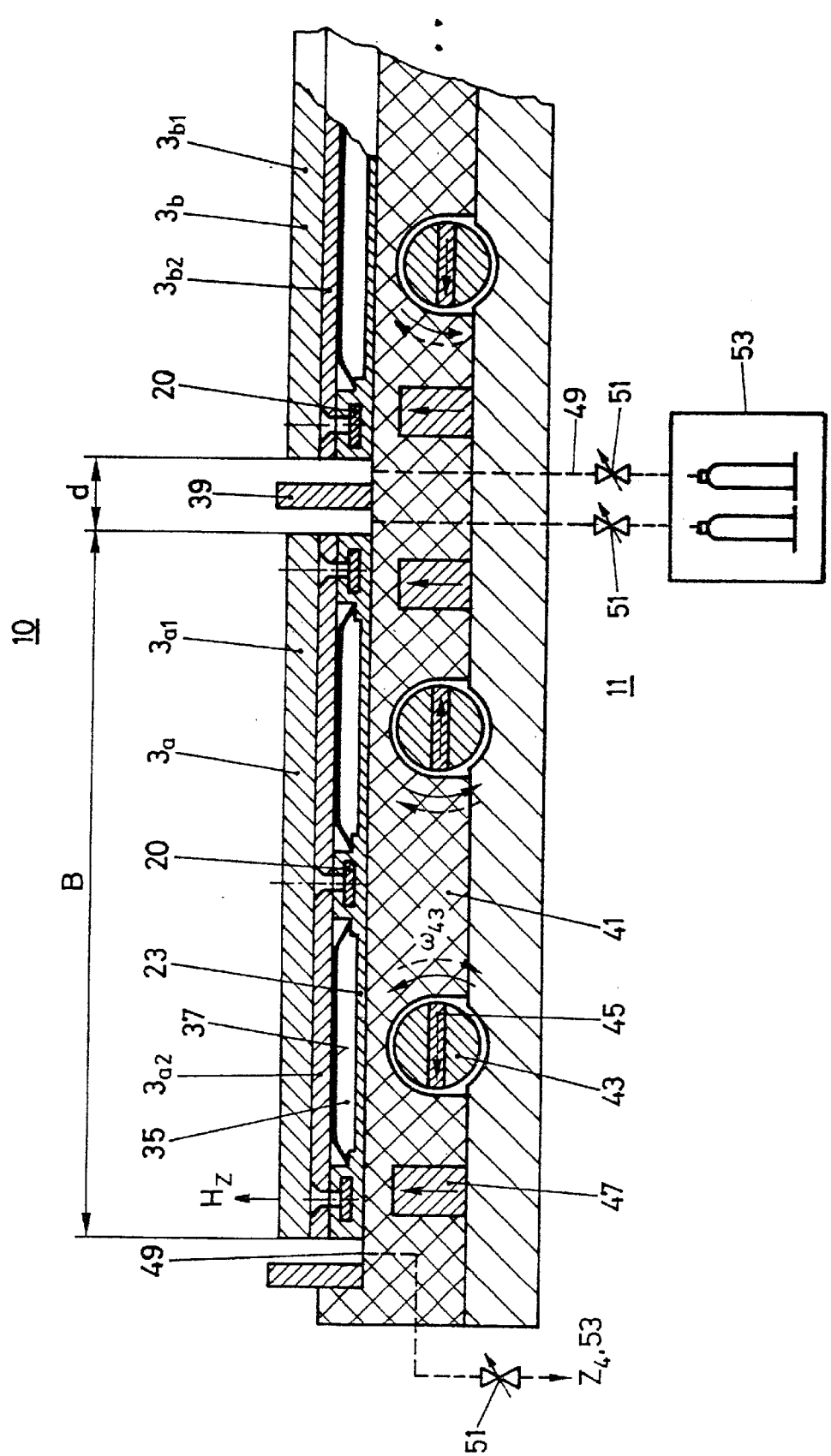
FIG. 4 Cross-sectional detail of a magnetron sputtering source according to the invention.

FIG. 4 is a cross-sectional detail of a magnetron sputtering source according to the invention in a preferred version. As shown in FIG. 4 the target arrangements comprise one target plate $3_{a1}$ or $3_{b1}$ each made of the material to be sputtered and which are bonded to one backing plate each $3_{a2}$ or $3_{b2}$ respectively. With the aid of the linear bayonet catches 20 the target arrangements 3 are fixed on their lateral periphery and/or in their center area to a metallic cooling plate 23.

Figure 5:
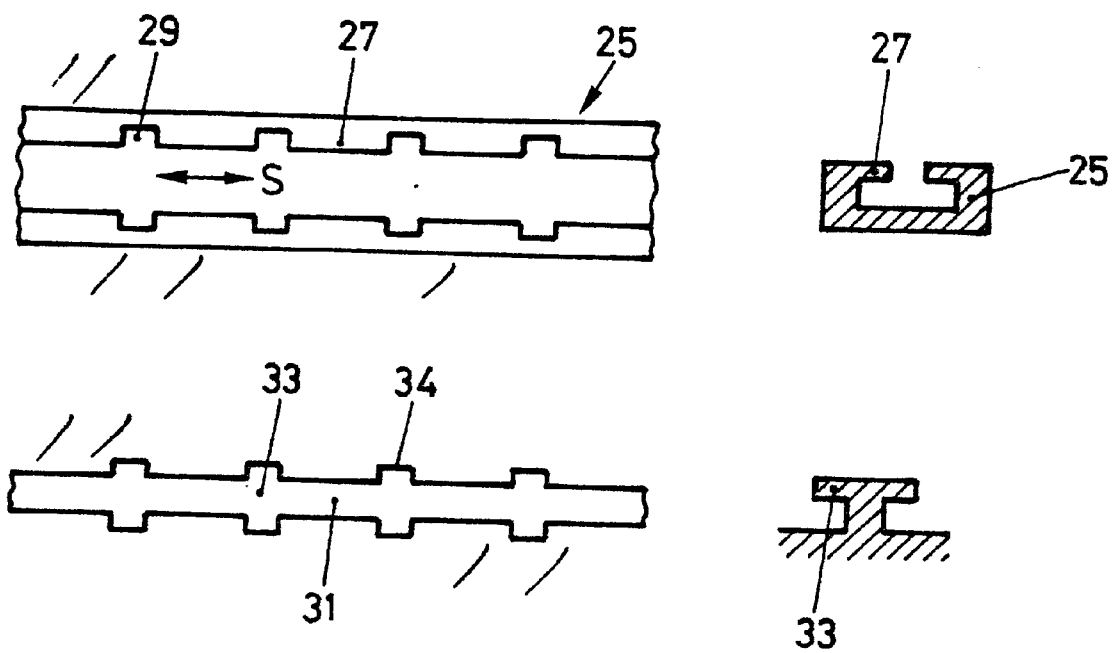
FIG. 5 Top view of a linear bayonet catch is used preferably on the source according to FIG. 4.

The design of the linear bayonet catches is illustrated in FIG. 5 according to which a hollow rail is provided either on target arrangement 3 or on cooling plate 23, which rail has a U-shaped cross-section, with inwardly bent U-legs 27 on which recesses 29 are created at a certain distance. On the other of the two parts, preferably on target arrangement 3, a linear rail with a T-shaped cross-section is provided on which the ends of the cross-member 33 feature protrusions 34. By inserting the protrusions 34 into the recesses 29 and by linear shifting in direction S the two parts are interlocked. It is possible, of course, in the sense of reversal, to create protrusions on the hollow rails that engage into corresponding recesses on rail 31.

The target arrangements 3 are clamped to the cooling plate 23 only when pressure is applied by the cooling medium in cooling channels 35 of cooling pate 23. These channels 35 extend along the predominantly flat area of the target arrangement surface facing cooling plate 23. Cooling channels 35, pressurized by a liquid cooling medium under pressure as described above, are sealed against the target arrangement by a foil type membrane 37, as is described in detail, for example, in CH-A-687 427 of the same applicant. Under pressure of the cooling medium foils 37 press tightly against the bottom of plate $3_{a2}$ or $3_{b2}$ respectively. Only when the cooling medium is put under pressure does the target arrangement become rigidly clamped in the bayonet catch. For removing the target arrangement 3 the complete cooling system or the corresponding cooling system section is pressure relieved, as a result of which the target arrangements can be easily pushed out and removed or replaced.

Anode strips 39 are positioned on the longitudinal side of the target arrangements 3. The anode strips as well as cooling plate 23 are mounted on a supporting base 41 which preferably is made at least partially of insulating material, preferably plastic. Base 41 separates the vacuum atmosphere in process chamber 10 from the ambient or normal atmosphere in space 11.

On the atmosphere side of base 41, for example, two permanent magnet drums 43, extending along the longitudinal dimension of the target arrangement, are supported in a rotating fashion and are driven with pendulum motion by motors (not shown). In pendulum motion they preferably perform a 180° angle pendulum movement—ω43. In the permanent magnet drums 43, permanent magnets 45 are mounted along the longitudinal drum dimension, preferably diametrically.

Figure 6:
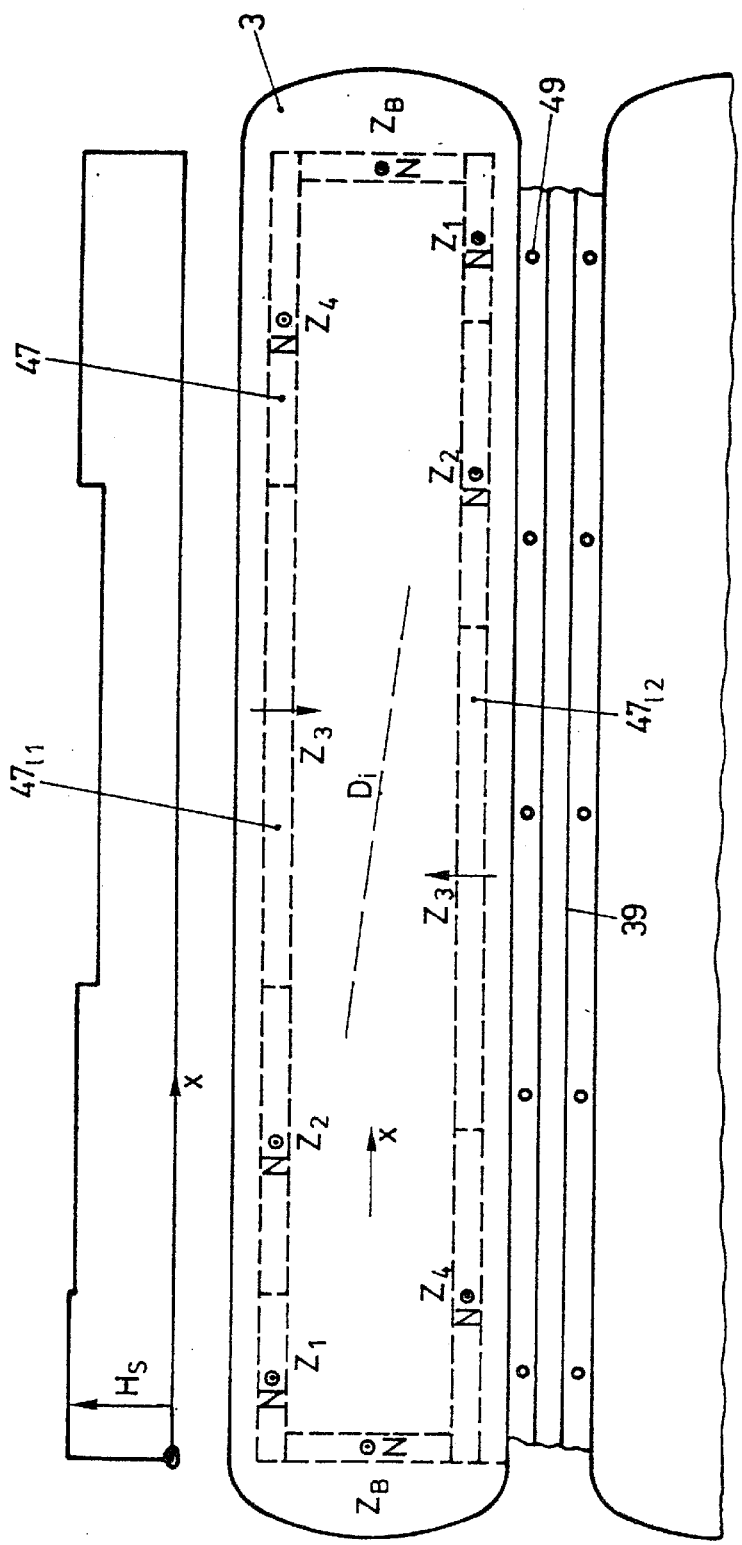
FIG. 6 Simplified top view of a detail of a magnetron source according to the invention.

Also on the atmosphere side of base 41 one permanent magnet frame 47 for each target arrangement 3 is mounted which essentially runs below and along the periphery of the corresponding target arrangement 3, as shown in FIG. 6.

In particular along the longitudinal sides of the target arrangements gas inlet lines 49 terminate as shown in FIG. 6, which can be controlled completely independently of each other, preferably in rows, with respect to the gas flow, as shown with dashed lines in FIG. 4. This is schematically shown in FIG. 4 with servo valves 51 that are provided in a connection between lines 49 and a gas tank arrangement 53 with working gas such as argon and/or with a reactive gas.

With respect to the operation and design of the permanent magnet drum 43 we again refer fully to the disclosure content of EP-0 603 587 or U.S. Pat. No. 5,399,253 respectively.

FIG. 6 shows a simplified top view detail of a magnetron source in FIG. 4 according to the invention. As already described based on FIG. 4 a permanent magnet frame 47 is installed below each target arrangement 3. Preferably the magnet frame 47 is designed in such a way that when viewed in a chamber direction, for example according to $H_z$ in FIG. 4, the magnet field generated by the permanent magnet frame changes locally along the longitudinal sides of the target arrangements 3, as shown in FIG. 6 with x. In a preferred design the magnets arranged on the longitudinal legs $471_1$ and $471_2$ of frame 47 are subdivided in to zones, for example, four zones as shown in FIG. 6. In the diagram of FIG. 6 the field strength of the permanent magnets in the individual zones Z1 to Z4 is qualitatively shown through coordinate x and thereby the field strength distribution in the x direction. In addition the permanent magnet dipole directions are shown in the corresponding zones Z.

On legs $471_{1,2}$ the same permanent magnet zones are preferably provided, however, specular symmetrical with respect to the diagonal $D_i$ of the long target arrangement 3.

Figure 7:
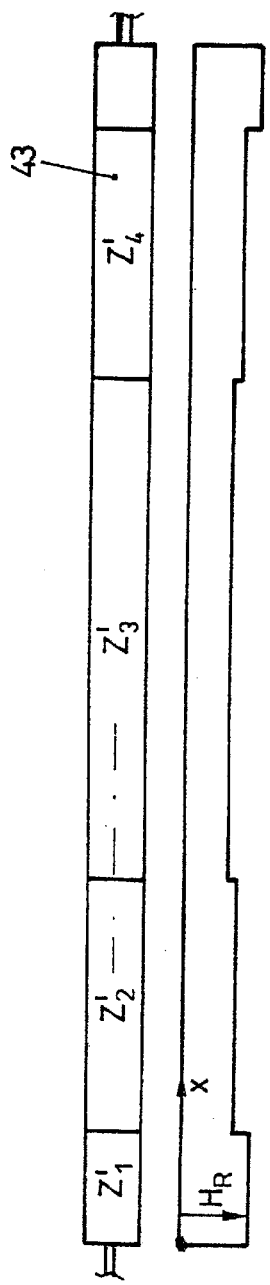
FIG. 7 Top view of a preferred design version of a permanent magnet drum preferably provided according to FIG. 6 on the magnetron sputtering source according to the invention.

Through a specific design of the local magnet field distribution that is achieved through the permanent magnet frames 47 on the target arrangements 3 it is possible to optimize the path of the circulating electrons and consequently the location and shape of the erosion profiles on the individual target arrangements. This in particular by taking into consideration the path deformations caused by drift forces. On the broad sides of the target frames 47 permanent magnet zones $Z_B$ are provided which preferably correspond to zone $Z_2$. As mentioned before also a single-target source according to FIGS. 4, 6 and 7 is inventive.

Magnet fields H which vary locally in the x direction above the corresponding target arrangements 3 which varies also as a function of the magnet drum pendulum motion and varies also in time, is specifically designed by choosing the field strength of the provided permanent magnets such as in zones $Z_1$, $Z_2$, $Z_4$ and/or through the spatial dipole orientation such as in zone $Z_3$, and/or in the position (distance from the target arrangement).

As mentioned, at least two permanent magnet drums 43 are preferably provided on each of the target arrangements 3 provided on the sputtering source according to the invention. One such drum is shown in FIG. 7.

Preferably different permanent magnet zones, for example, $Z'_1$, to $Z'_4$ are provided also on drums 43. FIG. 7 qualitatively shows the progression of the locally varying permanent magnet field $H_r(x)$ along the provided drums, in accordance with the preferred design.

On the source according to the invention the location and time distribution of the sputter rate is optimized through specific location and/or time distribution of the electrical supply of the individual target arrangements and/or specific location and/or time variation of the magnetron magnet field on the individual target arrangements and/or through specific location and/or time variation or design of the gas inflow conditions on the inlet openings 49. In the preferred design version that has been explained based on FIGS. 4 to 7, these variables are preferably exploited in combination in order to specifically design, preferably homogeneously, the film thickness distribution on a substrate to be sputter coated, in particular a flat substrate.

Figure 8:
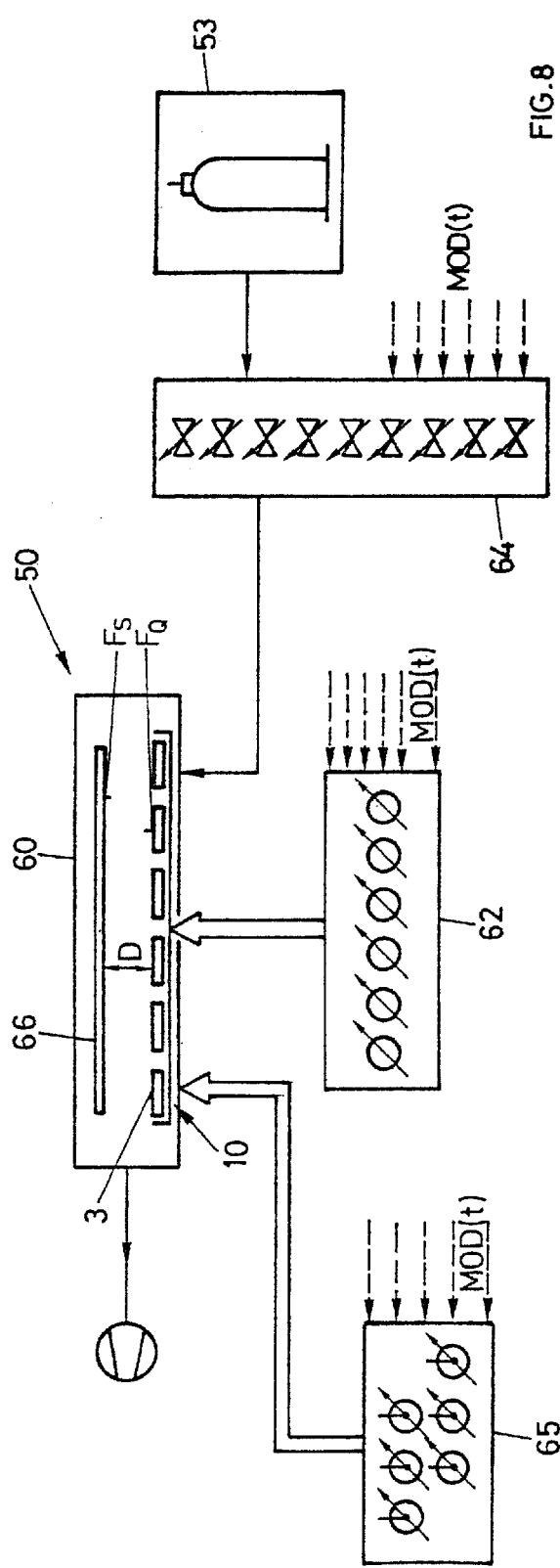
FIG. 8 Schematic representation of a sputter coating system according to the invention.

FIG. 8 schematically shows a sputter coating system 50 according to the invention with a sputter coating chamber 60 according to the invention in which is also schematically shown a magnetron sputtering source 10 according to the invention. The schematically shown source 10 as implemented in a preferred version features six target arrangements 3 and is also preferably designed as has been explained based on FIGS. 4 to 7. The source according to the invention with its target arrangements is operated with independent electrical supplies that can possibly be modulated, as shown in block 62. Further, the gas inflow conditions—which can possibly be modulated, in particular along the longitudinal dimensions of the target arrangements as shown with servo valve 64, are selectively set in order to admit a working and/or reactive gas from gas tank 53 into the process chamber.

With drive block 65 the drive—which can possibly be path/time modulated—for the permanent magnet drums on the source according to the invention is shown on which, preferably selectively, the desired drum pendulum motions can be set.

In chamber 60 according to the invention a substrate holder 66 is provided, in particular for holding a flat substrate to be coated. Based on the capabilities offered by the source according to the invention of optimally setting the time and location distribution of the material sputtered off by source 10, in particular a uniform distribution that has been averaged over time, in particular also in the edge zones of the source, it is possible to make the ratio $V_{QS}$ of the sputtering surface $F_Q$ of the source to the substrate surface $F_S$ to be coated astonishingly small, preferably $V_{QS} \leq 3$, preferably $V_{QS} \leq 2$, and even more preferably $1.5 \leq V_{QS} 2$.

This ratio shows that the material sputtered off the source is used very efficiently because only correspondingly little of the sputtered material is not deposited on the substrate surface. This efficiency is further enhanced because distance D—due to the large-surface distributed plasma coating of the source—between the substrate surfaces to be sputtered and the virgin surface of the magnetron source 10, can be selected very small, essentially equal to width B (see FIG. 4) of the sputter surfaces on target arrangements 3 and preferably 60 mm≦D≦250 mm
preferably 80 mm≦D≦160 mm.

Through said small distances D a high deposition rate is achieved with high sputtering efficiency which results in a highly economical coating process.

On the system shown in FIG. 8 the outermost target arrangements are preferably operated by generators 62 with higher sputtering power, preferably 5 to 35% higher, and even more preferably with 10 to 20% higher sputtering power than the inner target arrangements. The permanent magnet drums provided on source 10 according to FIG. 4 are preferably operated in pendulum mode with a pendulum frequency of 1 to 4 Hz, preferably with approx. 2 Hz.

The magnetron sputtering source, sputtering chamber or system, in particular in preferred operation, are particularly suitable for magnetron sputter coating large-surface, in particular flat substrates, with a high-quality film, with desired distribution of the film thickness, in particular a homogenous film thickness distribution in combination with high process economy. A significant contribution to this is made by the large-surface, homogeneously distributed process conditions on the source according to the invention. As a consequence the invention can be used for coating large-surface semiconductor substrates, but in particular for coating substrates of flat display panels, in particular TFT or PDP panels. This invention is in particular used for reactive coating of said substrates, in particular with ITO films or for metal coating said substrates through non-reactive sputter coating. In the subsequent examples preferred sizes of the source according to the invention or the chamber or the system are summarized.

1. Geometry
1.1 On the source

Lateral distance d according to FIG. 4: maximum 15%, preferably maximum 10%, even more preferably maximum 7% of the width dimension B of the target arrangements and/or 1 mm≦d≦230 mm, preferably 7 mm≦d≦20 mm.

Virgin surfaces of the target arrangements along one plane;

Width B of the target arrangements:

60 mm≦B≦350 mm, preferably 80 mm≦B≦200 mm.

Length of the target arrangements L: at least B, preferably considerably longer, preferably 400 mm≦L≦2000 mm.

End area of the targets: e.g. semicircular.

1.2 Source/substrate:

Ration $V_{QS}$ of the dimension of sputtering surface $F_Q$ to the dimension of the substrate surface $F_S$, to be coated:

$V_{QS}$≦3, preferably $V_{QS}$≦2, or preferably even 1.5≦$V_{QS}$≦2.

Smallest distance of the virgin source surfaces/coating surfaces D:

60 mm≦D≦250 mm, preferably 80 mm≦D≦160 mm.

Substrate sizes: for example 750×630 mm, coated with a source having a sputtering surface of: 920×900 mm, or Substrate size: 1100×900 mm, with a source having a sputtering surface of: 1300×1200 mm.

1.3 Cooling:

Ratio sputtering surface to cooling surface $V_{SK}$:

1.2≦$V_{SK}$≦1.5.

2. Operating variables

Target temperature T:

40° C.≦T≦150° C., preferably

60° C.≦T≦130° C.

Sputter power per unit of sputtering surface: 10 to 30 W/cm², preferably 15 to 20 W/cm².

Outermost target arrangements on each side, preferably with 5 to 35% more sputter power, preferably 10 to 20% more sputter power per unit of surface.

Pendulum frequency of the magnet drums: 1 to 4 Hz, preferably approx. 2 Hz.

Results: The following deposition rates were achieved:

ITO: 20 Å/sec.
Al: 130 to 160 Å/sec.
Cr: 140 Å/sec.
Ti: 100 Å/sec.
Ta: 106 Å/sec.

Figure 9:
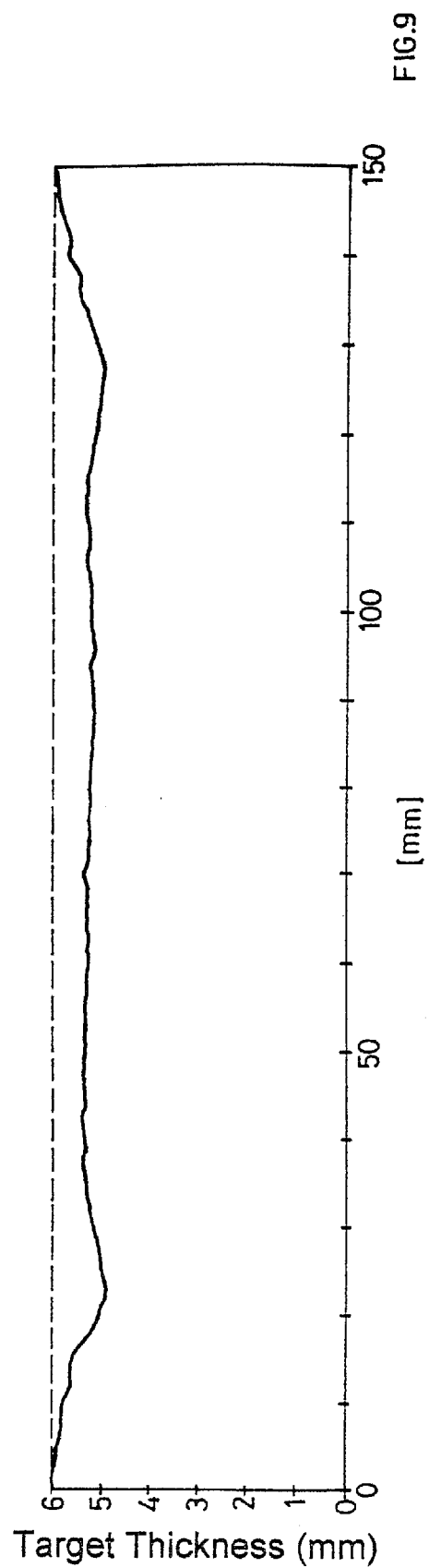
FIG. 9 Erosion profile on a target arrangement of the source according to the invention.

FIG. 9 shows the erosion profile on a 15 cm wide sputtering surface in a target arrangement on the source according to the invention. Due to the extremely uniform erosion the "race tracks" or erosion profiles are barely recognizable.

Figure 10:
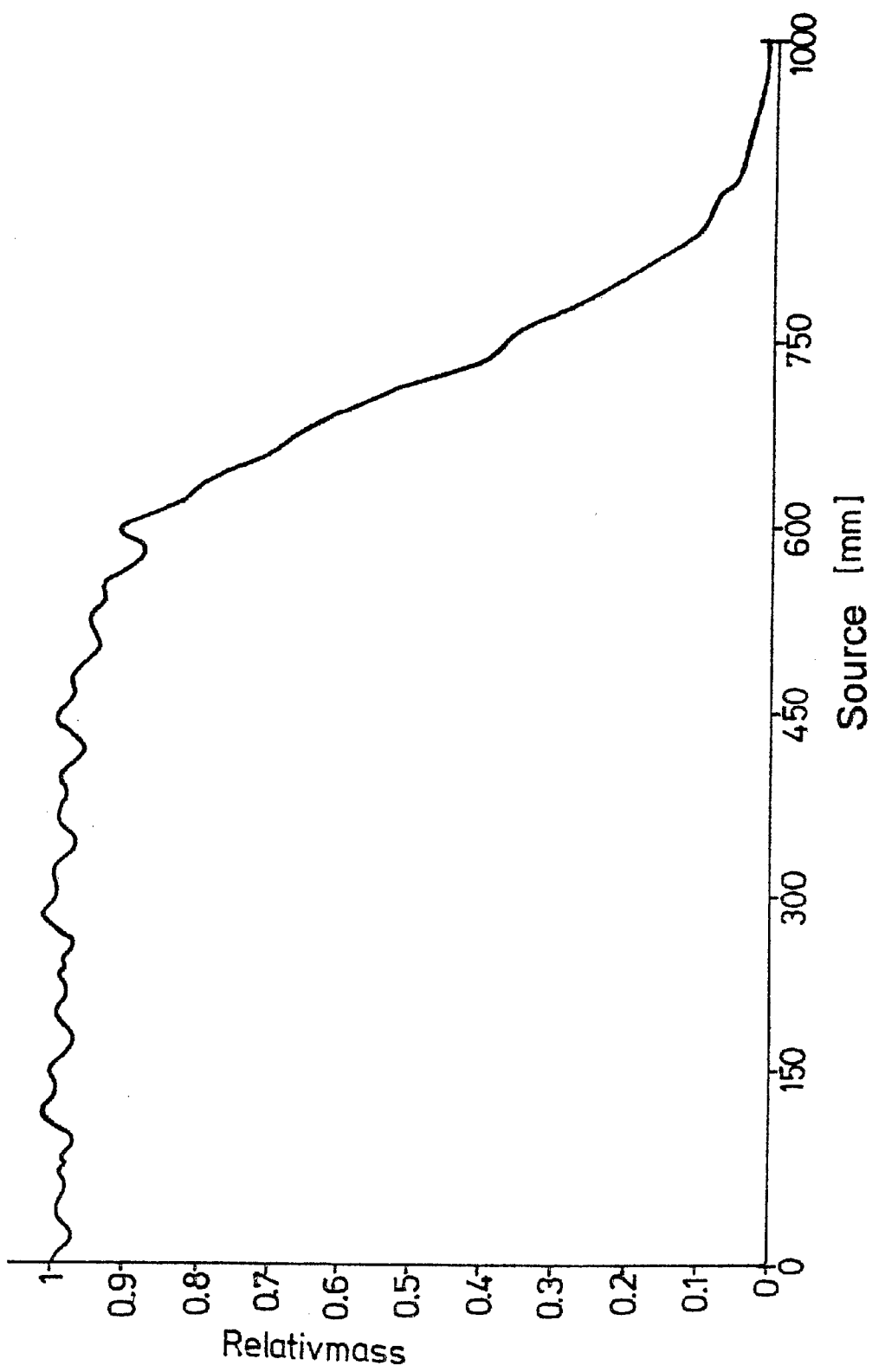
FIG. 10 Distribution of the sputtered material, determined on a source according to the invention with five target arrangements.

FIG. 10 shows the resulting coating rate distribution of ITO sputtering, based on a source according to the invention with five target arrangements, each with a sputtering surface width B of 150 mm. In this distribution, film thickness deviations of only ±3.8% are achieved on a substrate arranged at a distance D of 120 mm from the source surface.

Figure 11:
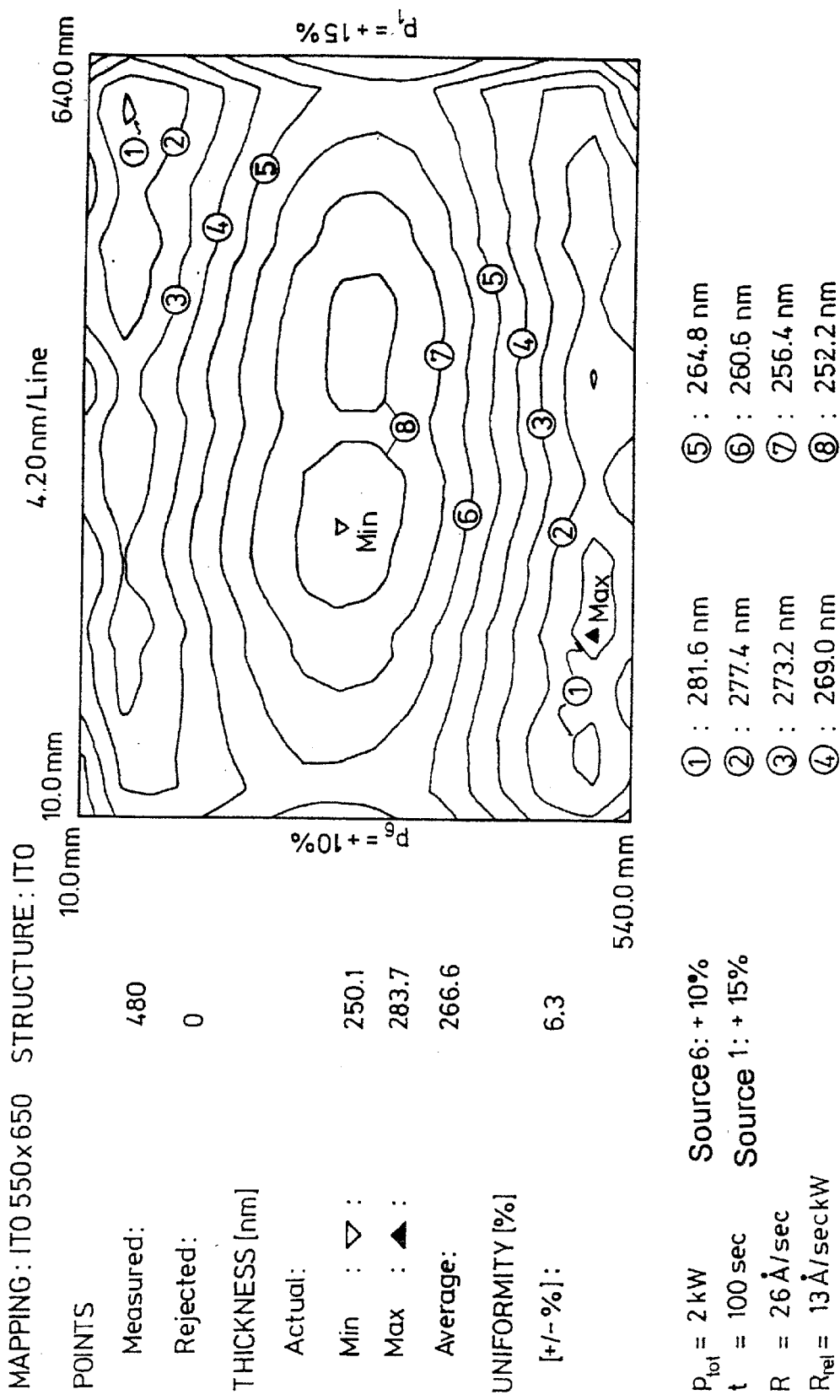
FIG. 11 Film thickness relief pattern on a 530×630 mm$^2$ glass substrate coated by a source according to the invention.

In FIG. 11 the resulting film thickness distribution on a large-surface glass substrate is shown which has been coated as follows:

| | |
|---|---|
| Total sputtering power $P_{tot}$: | 2 kW |
| Sputtering time: | 100 sec. |
| Deposition rate R: 26 Å/sec., relative: | 13 Å/sec. kW |
| Source with six target arrangements of which the outermost arrangements have been operated with an elevated sputter power of 10 or 15% respectively ($p_1$, $p_6$): | |
| Substrate size: | 650 × 550 mm |

In FIG. 11 the edge zones of the substrate that were above the target arrangements operated with elevated sputter power are marked. In the ITO coating process the film thickness deviation relative to the mean film thickness of 267 nm was ±6.3%.

The present invention avoids the following disadvantages of known sputtering sources, in particular with respect to the coating of large-surface workpieces:

Because according to the invention a uniform distribution of the process conditions over a large magnetron sputtering surface is possible with high deposition rate and high sputter rate utilization, high economy is achieved when coating large-surface substrates, or possibly in the simultaneous coating of many individual substrates.

Because on the source according to the invention simultaneous sputtering over a large surface takes place, better film thickness distribution on the substrate is achieved and arcing is prevented.

As the problem of reactive gas distribution and/or target erosion distribution is solved in a homogenizing sense, the substrates to be coated can be positioned much closer to the source and have much larger coating surfaces relative to the source surface, which improves the economy of a sputter coating system that is equipped with a source according to the invention.

The problem of plasma density differences between the target center and target periphery occurring on large-surface targets due to missing anodes in the target center is remedied.

The source can be adapted flexibly to the corresponding size requirements by means of modular target arrangements.

The problem occurring with large-surface targets where there is reactive process gas starvation in the middle of the target, is solved because the gas inlets 49 are distributed across the actual source surface.

Because (see FIG. 4) the base (41) is between process vacuum and atmospheric pressure it is no longer necessary to provide a heavy cooling plate (23) that can absorb this load. As a result the source becomes less elaborate and better penetration of the fields of the magnet arrangements (47, 43) located below the target arrangement (3) is achieved.

Through the selective control of the following distributions:

by time and/or location, electrical operation of the target arrangements by time and/or location, magnetic operation of the target arrangements by time and/or location, gas inlet it is possible to optimally adjust the film thickness distribution, especially homogeneously, of large-surface substrates.

Due to the provided bayonet catches in conjunction with the clamping of the target arrangements via the cooling media pressure extremely simple and fast exchange of the target arrangements is possible and large-surface, efficient cooling is achieved.

Due to the bayonet catches provided below the sputtering surfaces no fixing elements, and in particular no fixing elements made of non-sputtering material, are accessible from the process chamber.

What is claimed is:

1. A sputter coating chamber with a sputter source, comprising: at least two electrically mutually isolated stationary bar-shaped target arrangements, mounted one alongside the other and separated by respective slits; each of said target arrangements comprising a respective electric pad so that each of said target arrangements may be operated electrically independently from the other target arrangement; each target arrangement comprising a controlled magnet arrangement generating a time varying magnetron field upon the respective target arrangement and thus forming a magnetron sputtering source; a substrate holder for at least one substrate to be sputter-coated, said holder being arranged distant and opposite to said magnetron sputtering source, the ratio $V_{QS}$ of a sputtering surface ($F_Q$) said sputter source to a surface ($F_S$) of a substrate held by said substrate holder and to be sputter-coated being $V_{QS} \leq 3$.

2. The chamber of claim 1, further comprising an anode arrangement comprising anodes alongside and between said target arrangements and/or along a smaller side of said target arrangements.

3. The chamber of claim 1, wherein the magnet arrangements comprise a frame with electrical and/of permanent magnets along said target arrangements.

4. The chamber of claim 1, wherein the magnet arrangements respectively generate a tunnel-shaped magnetic field upon respective target arrangements with a time varying apex of said tunnel-shaped magnetic field.

5. The chamber of claim 1, wherein the magnet arrangements each comprise at least two drivingly rotatable or rotatably pivotable drums with permanent and/or electric magnets.

6. The chamber of claim 5, wherein said drums are arranged along a length of said bar-shaped target arrangements.

7. The chamber of claim 1, wherein said target arrangements are mounted on a base, said base being adjacent each of said target arrangements and including a cooling medium channel arrangement sealingly covered by a foil.

8. The chamber of claim 7, wherein said base is adaped to withstand a pressure difference of sputtering vacuum to surrounding atmosphere pressure.

9. The chamber of claim 1, wherein said target arrangements are mounted on a base, said magnet arrangements comprising stationary magnets mounted into electrically isolating material of said base.

10. The chamber of claim 1, wherein said target arrangements are mounted on electrically isolating material of a base.

11. The chamber of claim 1, comprising an anode arrangement mounted on electrically isolating material of a base.

12. The chamber of claim 1, wherein the magnet arrangements comprise mechanically movable permanent magnets and/or electro-magnets beneath said target arrangements, said magnets being mounted on electrically isolating material of a base.

13. The chamber of claim 1, further comprising a base wherein said target arrangements are mounted, said base comprising cooling medium channels defined in electrically isolating material of said base.

14. The chamber of claim 13, wherein bottom surfaces of said cooling medium channels are formed by metallic plate material.

15. The chamber of claim 1, further comprising a gas inlet arrangement with gas inlet openings arranged alongside said target arrangements and communicating with a gas distribution system.

16. The chamber of claim 1, wherein said target arrangements are distant from each other by a distance of at most 15% of a width of one of said bar-shaped target arrangements.

17. The chamber of claim 16, wherein said distance is at most 10% of said width.

18. The chamber of claim 17, wherein distance is at most 7% of said width.

19. The chamber of claim 1, wherein said bar-shaped target arrangements have a length which is signigicantly larger than their width.

20. The chamber of claim 19, wherein said length identified as L is in the range: $400 \text{ mm} \leq L \leq 2000 \text{ mm}$.

21. The chamber of claim 1, wherein said target arrangements are distant from each other by distance d wherein $1 \text{ mm} \leq d \leq 230 \text{ mm}$.

22. The chamber of claim 21, wherein $7 \text{ mm} \leq d \leq 20 \text{ mm}$.

23. The chamber of claim 19, wherein there is a width B of respective ones of said target arrangements and:

$60 \text{ mm} \leq B \leq 350 \text{ mm}$.

24. The chamber of claim 23, wherein $80 \text{ mm} \leq B \leq 200 \text{ mm}$.

25. The chamber of claim 1, wherein sputtering surfaces of said target arrangements in unsputtered condition are aligned substantially along a plate.

26. The chamber of claim 1, wherein the magnet arrangements generate a magnetic field which considered at moments of time, locally varies along the length of said bar-shaped target arrangements.

27. The chamber of claim 1, wherein a frame with magnets surrounds at least some of said target arrangements and said magnets in said frame and alongside at least some of said target arrangements are of mutually different magnetic strength.

28. The chamber of claim 1, wherein at least two driving pivotable magnet drums are mounted parallel to each other, beneath and along said target arrangements and comprise magnets, the position and/or the strength of which magnets varying in the direction of axes of said magnet drums.

29. The chamber of claim 28, wherein said magnets of said magnet drums are permanent magnets.

30. The chamber of claim 1, further comprising a frame surrounding at least a part of said target arrangements, said frame comprising magnets arranged along the length of said frame and being of different magnetic strengths considered along said length, magnetic strengths of said magnetic strengths considered along said length, magnetic strengths of said magnets being substantially symmetrical to a diagonal of said frame.

31. The chamber of claim 30, wherein said magnets of said frame are permanent magnets.

32. The chamber of claim 1, wherein said target arrangements are mounted to a base via linearly bayonet links.

33. The chamber of claim 1 comprising more than two of said target arrangements.

34. The chamber of claim 31, comprising at least five of said target arrangements 35. The chamber of claim 1, wherein $V_{QS} \leq 2$.

36. The chamber of claim 1, wherein $1.5 \leq V_{QS} \leq 2$.

37. The chamber of claim 1, wherein said surface to be sputter-coated of said substrate held in said substrate holder is distant from a virgin magnetron sputtering source surface by a distance D, said distance D being substantially equal to a width of one of said target arrangements.

38. The chamber of claim 1, wherein said surface to be sputter-coated of said substrate held in said substrate holder is distant from a virgin magnetron sputtering source by a distance D for which there is valid: $60 \text{ mm} \leq D \leq 250 \text{ mm}$.

39. The chamber according to claim 38, wherein: $80 \text{ mm} \leq D \leq 160 \text{ mm}$.

40. The chamber of claim 1, further comprising electrical generators connected to said electric pads of said target arrangements, said electric generators being controllable in mutual independency.

41. The chamber of claim 40, including an AC-generator with an output connected commonly to more than one of said pads.

42. The chamber of claim 40, at least one of said generators being a DC-generator, an AC-generator or a generator for outputting AC and DC.

43. The chamber of claim 1, further comprising at least one DC-generator connected to at least one of said pads via a chopper unit.

* * * * *